(12) United States Patent
Hsu et al.

(10) Patent No.: US 9,754,984 B2
(45) Date of Patent: Sep. 5, 2017

(54) IMAGE-SENSOR STRUCTURES

(71) Applicant: VisEra Technologies Company Limited, Hsin-Chu (TW)

(72) Inventors: Chung-Jung Hsu, Hsinchu (TW); Chin-Chuan Hsieh, Hsinchu (TW); Zong-Ru Tu, Keelung (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 475 days.

(21) Appl. No.: 14/497,842

(22) Filed: Sep. 26, 2014

(65) Prior Publication Data

US 2016/0093658 A1 Mar. 31, 2016

(51) Int. Cl.
*H01L 27/146* (2006.01)

(52) U.S. Cl.
CPC .. *H01L 27/14621* (2013.01); *H01L 27/14623* (2013.01); *H01L 27/14636* (2013.01)

(58) Field of Classification Search
CPC ......... H01L 27/14621; H01L 27/14623; H01L 27/14636
See application file for complete search history.

(56) References Cited

U.S. PATENT DOCUMENTS

| | | | | |
|---|---|---|---|---|
| 2011/0285640 A1* | 11/2011 | Park | ............... | G02F 1/13338 345/173 |
| 2014/0263962 A1* | 9/2014 | Ahn | ............... | H01L 27/14618 250/208.1 |

FOREIGN PATENT DOCUMENTS

| | | |
|---|---|---|
| JP | 08-271719 | 10/1996 |
| JP | 2009176949 A | 8/2009 |
| JP | 2009239053 A | 10/2009 |
| JP | 2010161215 A | 7/2010 |
| JP | 2012-178521 A | 9/2012 |
| JP | 2014142628 A | 8/2014 |
| TW | 200805685 A | 1/2008 |
| TW | 201308166 A1 | 2/2013 |
| WO | WO 2012073402 A1 | 6/2012 |

OTHER PUBLICATIONS

English translation of JP 07035915.*
Taiwanese Office Action dated Aug. 2, 2016, as issued in corresponding Taiwan Patent Application No. 103139868 (4 pages).
An Office Action from corresponding Japanese Application No. 2015-015187 dated Feb. 6, 2017; 14 pgs.

* cited by examiner

*Primary Examiner* — Renee Chavez
(74) *Attorney, Agent, or Firm* — Muncy, Geissler, Olds & Lowe, P.C.

(57) ABSTRACT

An image-sensor structure is provided. The image-sensor structure includes a substrate, a plurality of photoelectric conversion units formed in the substrate, a plurality of separated color filters formed above the substrate and the photoelectric conversion units, a first light shielding layer surrounding the separated color filters, and a first conductive polymer element blended with a low-refractive-index component filled between the individual separated color filters and between the all separated color filters and the first light shielding layer, wherein the first conductive polymer element is electrically connected to a grounding pad.

20 Claims, 4 Drawing Sheets

IMAGE-SENSOR STRUCTURES

BACKGROUND OF THE INVENTION

Field of the Invention

The invention relates to an image-sensor structure, and more particularly to an image-sensor structure with a conductive polymer element(s).

Description of the Related Art

An image sensor, as a kind of semiconductor device, transforms optical images into electrical signals. Image sensors can be generally classified into charge coupled devices (CCDs) and complementary metal oxide semiconductor (CMOS) image sensors. Among these image sensors, a CMOS image sensor comprises a photodiode for detecting incident light and transforming it into electrical signals, and logic circuits for transmitting and processing the electrical signals.

In an image sensor, in order to avoid crosstalk between adjacent color filters, a grid is disposed between the color filters. Generally, metal or oxide can be adopted as the material of the grid. However, a metal grid may become corroded during the color filter processes due to exposure to photoresist, developer and DI water. Furthermore, an oxide grid has a constant refractive index (about 1.46) which is incapable of further increasing the variation of the refractive index between the grid and the color filters, thus decreasing the sensitivity of devices.

Additionally, during the semiconductor processes, such as a high-speed rotation step of a wafer, electrostatic charges may be generated on the wafer. Unfortunately, the electrostatic wafer will influence in-line measurement, obtaining error data, and induce high dark current.

Therefore, development of a novel grid with an appropriate material and an adjustable refractive index (which is capable of further increasing the variation of the refractive index between the grid and the color filters) which can improve device performance such as sensitivity or SNR (signal-to-noise ratio) and effectively solve the electrostatic charge issue is desirable.

BRIEF SUMMARY OF THE INVENTION

One embodiment of the invention provides an image-sensor structure comprising a substrate, a plurality of photoelectric conversion units formed in the substrate, a plurality of separated color filters formed above the substrate and the photoelectric conversion units, a first light shielding layer surrounding the separated color filters, and a first conductive polymer element filled between the individual separated color filters and between the all separated color filters and the first light shielding layer, wherein the first conductive polymer element is electrically connected to a grounding pad.

The photoelectric conversion unit comprises a photodiode.

The color filters comprise pigments, acrylic resins or sensitive polymers.

The first light shielding layer comprises pigments, acrylic resins or sensitive polymers.

The image-sensor structure further comprises a component blended with the first conductive polymer element. The component comprises fluoroacrylic polymers, fluoroacrylic copolymers, or a combination thereof. The component has a refractive index lower than 1.5. The component has a weight ratio of 1-20 wt % in the component and the first conductive polymer element.

The image-sensor structure further comprises a second light shielding layer surrounding the first light shielding layer. The second light shielding layer comprises metals.

In this embodiment, the first conductive polymer element is electrically connected to the grounding pad through metal vias and a metal line.

One embodiment of the invention provides an image-sensor structure comprising a substrate, a plurality of photoelectric conversion units formed in the substrate, a plurality of separated color filters formed above the substrate and the photoelectric conversion units, a first light shielding layer surrounding the separated color filters, and a first conductive polymer element filled between the individual separated color filters and between the all separated color filters and the first light shielding layer, wherein the first conductive polymer element is electrically connected to a grounding pad. The image-sensor structure further comprises a second light shielding layer surrounding the first light shielding layer. In this embodiment, the image-sensor structure further comprises a second conductive polymer element connected with the first conductive polymer element, wherein the second conductive polymer element is in contact with the second light shielding layer.

The first conductive polymer element is electrically connected to the grounding pad through the second conductive polymer element, the second light shielding layer, metal vias and a metal line.

One embodiment of the invention provides an image-sensor structure comprising a substrate, a plurality of photoelectric conversion units formed in the substrate, a plurality of separated color filters formed above the substrate and the photoelectric conversion units, a first light shielding layer surrounding the separated color filters, and a first conductive polymer element filled between the individual separated color filters and between the all separated color filters and the first light shielding layer, wherein the first conductive polymer element is electrically connected to a grounding pad. The image-sensor structure further comprises a second light shielding layer surrounding the first light shielding layer. In this embodiment, the image-sensor structure further comprises a third conductive polymer element connected with the first conductive polymer element, wherein the third conductive polymer element is through the first light shielding layer to connect to the second light shielding layer.

The first conductive polymer element is electrically connected to the grounding pad through the third conductive polymer element, the second light shielding layer, metal vias and a metal line.

One embodiment of the invention provides an image-sensor structure comprising a substrate, a plurality of photoelectric conversion units formed in the substrate, a plurality of separated color filters formed above the substrate and the photoelectric conversion units, a first light shielding layer surrounding the separated color filters, and a first conductive polymer element filled between the individual separated color filters and between the all separated color filters and the first light shielding layer, wherein the first conductive polymer element is electrically connected to a grounding pad. The image-sensor structure further comprises a second light shielding layer surrounding the first light shielding layer. In this embodiment, the image-sensor structure further comprises a fourth conductive polymer element connected with the first conductive polymer element, wherein the fourth conductive polymer element is through the first light shielding layer and over the second light shielding layer to connect to the grounding pad.

The first conductive polymer element is electrically connected to the grounding pad through the fourth conductive polymer element.

The image-sensor structure further comprises a plurality of microlenses formed above the separated color filters.

The image-sensor structure comprises a front-side illuminated image-sensor structure or a back-side illuminated image-sensor structure.

The invention adopts a conductive polymer blended with a low-refractive-index component, for example, fluoroacrylic polymers, fluoroacrylic copolymers, or a combination thereof to define an element(s) filled between color filters and between the color filters and a light shielding layer and connected to a grounding pad. The SNR (signal-to-noise ratio) of the image-sensor structure with the conductive polymer element(s) can thus be improved and the electrostatic charges generated during the semiconductor processes can thus be released from the image-sensor structure due to the formation of the conductive polymer element(s) with an adjustable refractive index which can increase the variation of the refractive index between the element(s) and the color filters and the arrangement of the electrical connection from the conductive polymer element(s) to the grounding pad which can effectively release the electrostatic charges.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
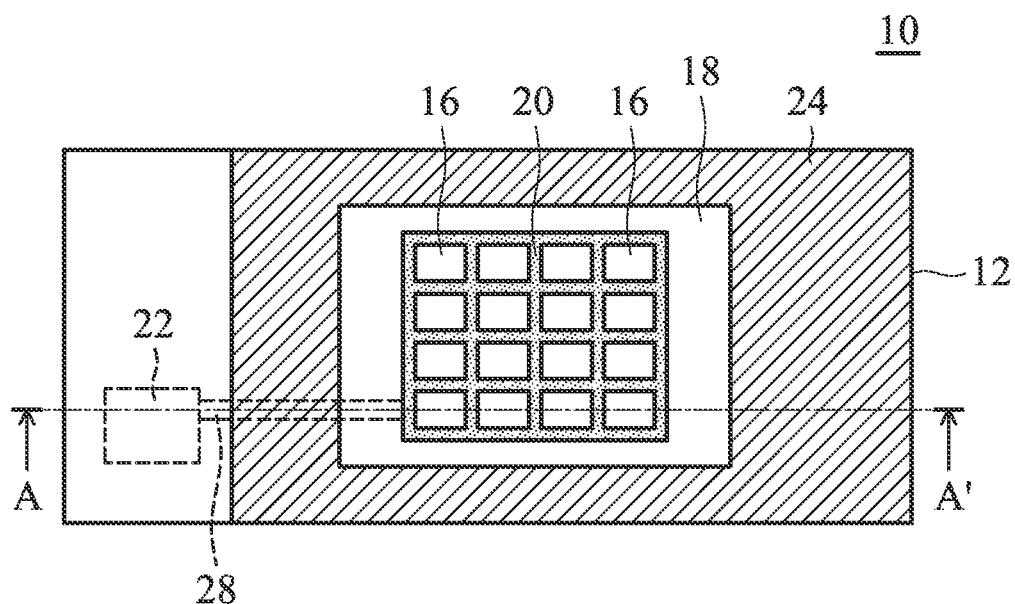
FIG. 1 is a top view of an image-sensor structure in accordance with one embodiment of the invention.
Figure 2:
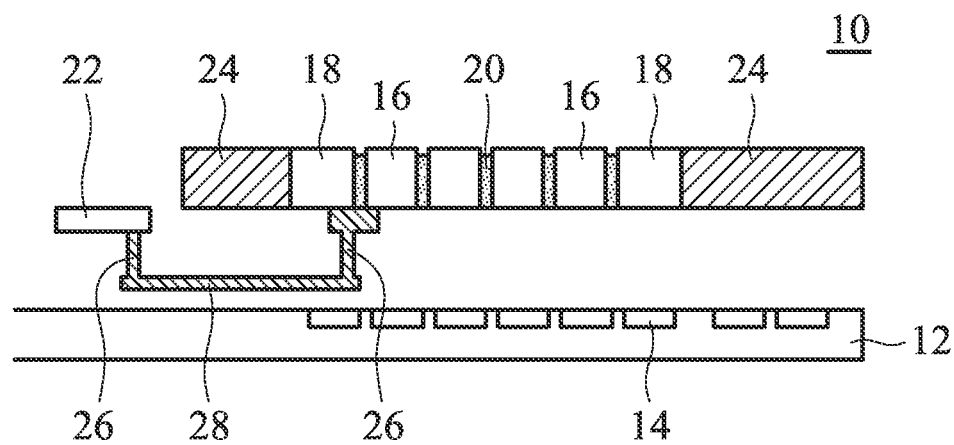
FIG. 2 is a cross-sectional view taken along cross-sectional line A-A' of FIG. 1, which illustrates an image-sensor structure in accordance with one embodiment of the invention.

An image-sensor structure according to one embodiment of the invention is described with reference to FIG. 1 and FIG. 2. FIG. 1 is a top view of the image-sensor structure. FIG. 2 is a cross-sectional view of the image-sensor structure taken along cross-sectional line A-A' of FIG. 1.

Referring to FIGS. 1 and 2, an image-sensor structure 10 is provided. The image-sensor structure 10 comprises a substrate 12, a plurality of photoelectric conversion units 14 formed in the substrate 12, a plurality of separated color filters 16 formed above the substrate 12 and the photoelectric conversion units 14, a first light shielding layer 18 surrounding the separated color filters 16 (as shown in FIG. 1), and a first conductive polymer element 20 filled between the individual separated color filters 16 and between the all separated color filters 16 and the first light shielding layer 18. The first conductive polymer element 20 is electrically connected, for example, "physically connected" or "not physically connected but through by means of a conducting path" to a grounding pad 22. Additionally, the photoelectric conversion units 14 and the separated color filters 16 are aligned with each other.

In some embodiments, the photoelectric conversion unit 14 may comprise a photodiode (PD).

In some embodiments, the color filters 16 may comprise pigments, acrylic resins or sensitive polymers.

In some embodiments, the first light shielding layer 18 may comprise pigments, acrylic resins or sensitive polymers.

In some embodiments, the image-sensor structure 10 may further comprise a component blended with the first conductive polymer element 20. In some embodiments, the component may comprise fluoroacrylic polymers, fluoroacrylic copolymers, or a combination thereof. In some embodiments, the component has a refractive index lower than about 1.5. In some embodiments, the component has a weight ratio of about 1-10 wt % or 1-20 wt % in the component and the first conductive polymer element 20.

In some embodiments, the image-sensor structure 10 may further comprise a second light shielding layer 24 surrounding the first light shielding layer 18 (as shown in FIG. 1). In some embodiments, the second light shielding layer 24 may comprise metals.

FIG. 2 represents the relationship among various elements, for example, metal line and metal via, in a conductive path. Referring to FIG. 2, in this embodiment, the first conductive polymer element 20 is electrically connected to the grounding pad 22 through metal vias 26 and a metal line 28. The area where the metal line and the metal via located may further include an anti-reflection layer, an anti-leakage layer, or layers of specific functions. In a front-side illuminated image-sensor structure, the area may further include a wiring layer.

In some embodiments, the image-sensor structure 10 may further comprise a plurality of microlenses (not shown) formed above the separated color filters 16.

In some embodiments, the image-sensor structure 10 may comprise a front-side illuminated image-sensor structure (not shown) or a back-side illuminated image-sensor structure (not shown).

Figure 3:
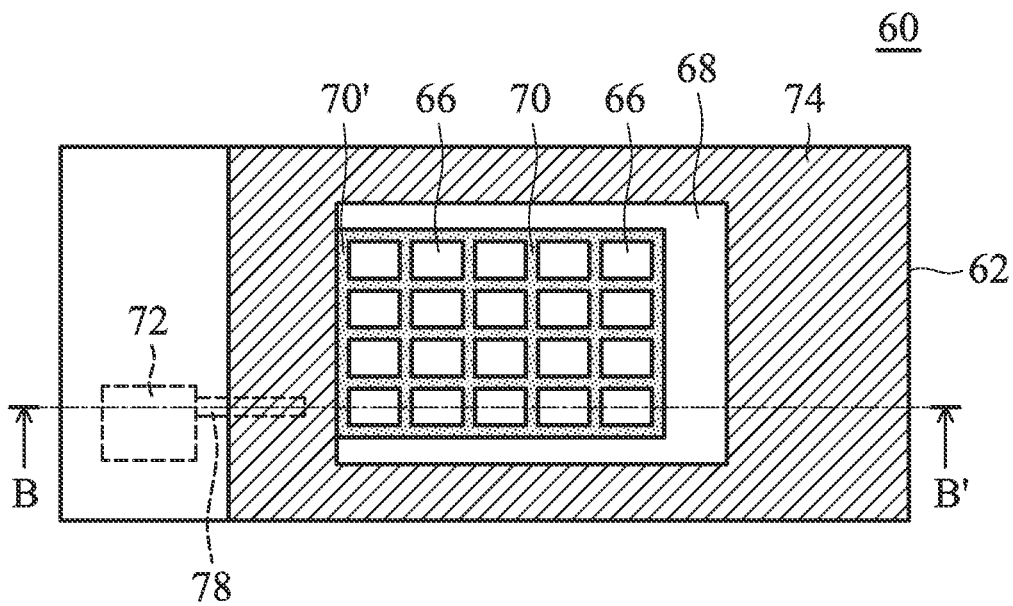
FIG. 3 is a top view of an image-sensor structure in accordance with one embodiment of the invention.
Figure 4:
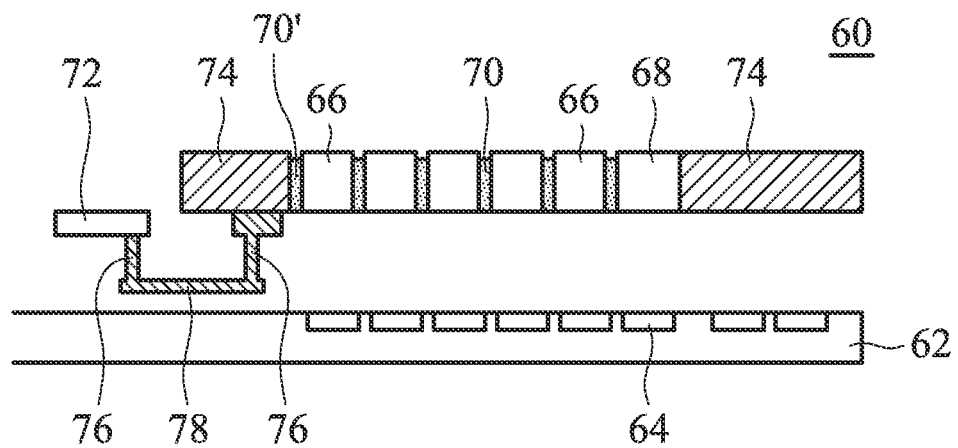
FIG. 4 is a cross-sectional view taken along cross-sectional line B-B' of FIG. 3, which illustrates an image-sensor structure in accordance with one embodiment of the invention.

An image-sensor structure according to one embodiment of the invention is described with reference to FIG. 3 and FIG. 4. FIG. 3 is a top view of the image-sensor structure. FIG. 4 is a cross-sectional view of the image-sensor structure taken along cross-sectional line B-B' of FIG. 3.

Referring to FIGS. 3 and 4, an image-sensor structure 60 is provided. The image-sensor structure 60 comprises a substrate 62, a plurality of photoelectric conversion units 64 formed in the substrate 62, a plurality of separated color filters 66 formed above the substrate 62 and the photoelectric conversion units 64, a first light shielding layer 68 surrounding the separated color filters 66 (as shown in FIG. 3), and a first conductive polymer element 70 filled between the individual separated color filters 66 and between the all separated color filters 66 and the first light shielding layer 68. The first conductive polymer element 70 is electrically connected, for example, "physically connected" or "not physically connected but through by means of a conducting path" to a grounding pad 72. Additionally, the photoelectric conversion units 64 and the separated color filters 66 are aligned with each other.

In some embodiments, the photoelectric conversion unit 64 may comprise a photodiode (PD).

In some embodiments, the color filters 66 may comprise pigments, acrylic resins or sensitive polymers.

In some embodiments, the first light shielding layer 68 may comprise pigments, acrylic resins or sensitive polymers.

In some embodiments, the image-sensor structure 60 may further comprise a component blended with the first conductive polymer element 70. In some embodiments, the component may comprise fluoroacrylic polymers, fluoroacrylic copolymers, or a combination thereof. In some embodiments, the component has a refractive index lower than about 1.5. In some embodiments, the component has a weight ratio of about 1-10 wt % or 1-20 wt % in the component and the first conductive polymer element 70.

In some embodiments, the image-sensor structure 60 may further comprise a second light shielding layer 74 surrounding the first light shielding layer 68 (as shown in FIG. 3). In some embodiments, the second light shielding layer 74 may comprise metals.

FIG. 4 represents the relationship among various elements, for example, metal line and metal via, in a conductive path. Referring to FIG. 4, in this embodiment, the image-sensor structure 60 may further comprise a second conductive polymer element 70' connected with the first conductive polymer element 70 and in contact with the second light shielding layer 74. In this embodiment, the first conductive polymer element 70 is electrically connected to the grounding pad 72 through the second conductive polymer element 70', the second light shielding layer 74, metal vias 76 and a metal line 78. The area where the metal line and the metal via located may further include an anti-reflection layer, an anti-leakage layer, or layers of specific functions. In a front-side illuminated image-sensor structure, the area may further include a wiring layer.

In some embodiments, the image-sensor structure 60 may further comprise a plurality of microlenses (not shown) formed above the separated color filters 66.

In some embodiments, the image-sensor structure 60 may comprise a front-side illuminated image-sensor structure (not shown) or a back-side illuminated image-sensor structure (not shown).

Figure 5:
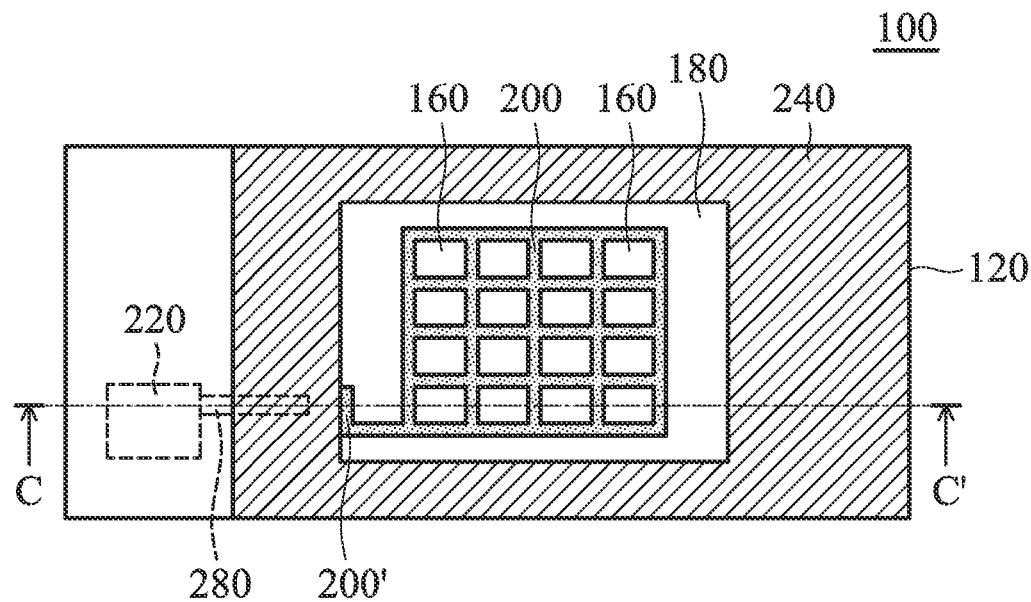
FIG. 5 is a top view of an image-sensor structure in accordance with one embodiment of the invention.
Figure 6:
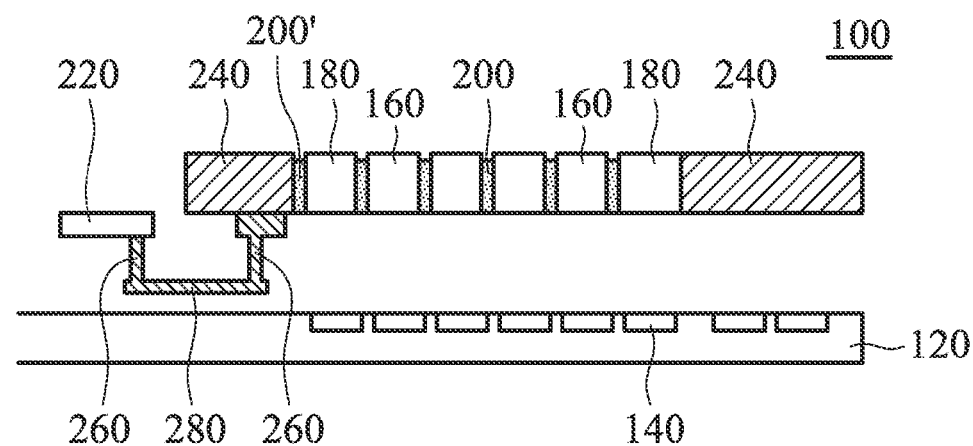
FIG. 6 is a cross-sectional view taken along cross-sectional line C-C' of FIG. 5, which illustrates an image-sensor structure in accordance with one embodiment of the invention.

An image-sensor structure according to one embodiment of the invention is described with reference to FIG. 5 and FIG. 6. FIG. 5 is a top view of the image-sensor structure. FIG. 6 is a cross-sectional view of the image-sensor structure taken along cross-sectional line C-C' of FIG. 5.

Referring to FIGS. 5 and 6, an image-sensor structure 100 is provided. The image-sensor structure 100 comprises a substrate 120, a plurality of photoelectric conversion units 140 formed in the substrate 120, a plurality of separated color filters 160 formed above the substrate 120 and the photoelectric conversion units 140, a first light shielding layer 180 surrounding the separated color filters 160 (as shown in FIG. 5), and a first conductive polymer element 200 filled between the individual separated color filters 160 and between the all separated color filters 160 and the first light shielding layer 180. The first conductive polymer element 200 is electrically connected, for example, "physically connected" or "not physically connected but through by means of a conducting path" to a grounding pad 220. Additionally, the photoelectric conversion units 140 and the separated color filters 160 are aligned with each other.

In some embodiments, the photoelectric conversion unit 140 may comprise a photodiode (PD).

In some embodiments, the color filters 160 may comprise pigments, acrylic resins or sensitive polymers.

In some embodiments, the first light shielding layer 180 may comprise pigments, acrylic resins or sensitive polymers.

In some embodiments, the image-sensor structure 100 may further comprise a component blended with the first conductive polymer element 200. In some embodiments, the component may comprise fluoroacrylic polymers, fluoroacrylic copolymers, or a combination thereof. In some embodiments, the component has a refractive index lower than about 1.5. In some embodiments, the component has a weight ratio of about 1-10 wt % or 1-20 wt % in the component and the first conductive polymer element 200.

In some embodiments, the image-sensor structure 100 may further comprise a second light shielding layer 240 surrounding the first light shielding layer 180 (as shown in FIG. 5). In some embodiments, the second light shielding layer 240 may comprise metals.

FIG. 6 represents the relationship among various elements, for example, metal line and metal via, in a conductive path. Referring to FIG. 6, in this embodiment, the image-sensor structure 100 may further comprise a third conductive polymer element 200' that connected the first conductive polymer element 200 and the second light shielding layer 240. The third conductive polymer element 200' goes across the first light shielding layer 180. In this embodiment, the first conductive polymer element 200 is electrically connected to the grounding pad 220 through the third conductive polymer element 200', the second light shielding layer 240, metal vias 260 and a metal line 280. The area where the metal line and the metal via located may further include an anti-reflection layer, an anti-leakage layer, or layers of specific functions. In a front-side illuminated image-sensor structure, the area may further include a wiring layer.

In some embodiments, the image-sensor structure 100 may further comprise a plurality of microlenses (not shown) formed above the separated color filters 160.

In some embodiments, the image-sensor structure 100 may comprise a front-side illuminated image-sensor structure (not shown) or a back-side illuminated image-sensor structure (not shown).

Figure 7:
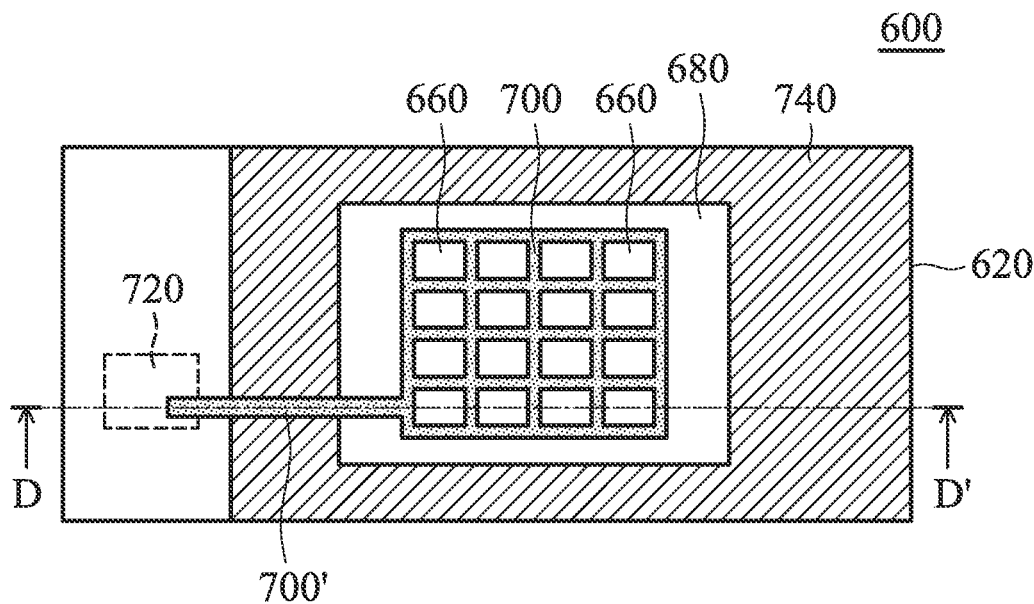
FIG. 7 is a top view of an image-sensor structure in accordance with one embodiment of the invention.
Figure 8:
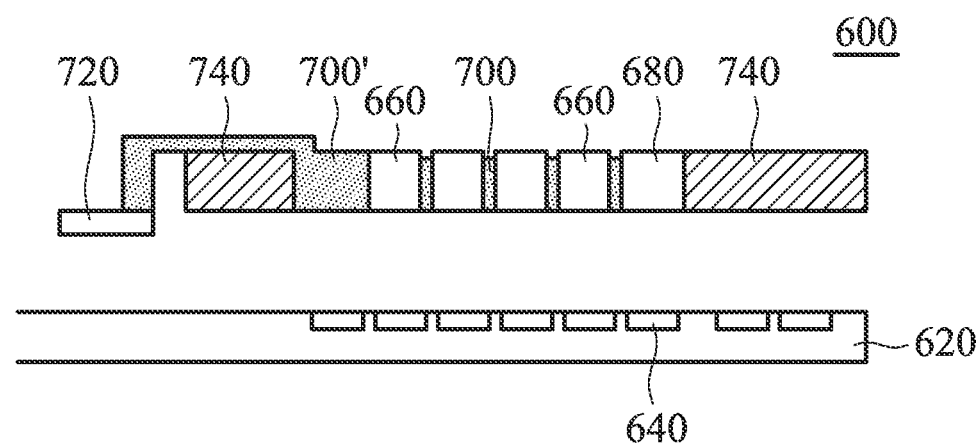
FIG. 8 is a cross-sectional view taken along cross-sectional line D-D' of FIG. 7, which illustrates an image-sensor structure in accordance with one embodiment of the invention.

An image-sensor structure according to one embodiment of the invention is described with reference to FIG. 7 and FIG. 8. FIG. 7 is a top view of the image-sensor structure. FIG. 8 is a cross-sectional view of the image-sensor structure taken along cross-sectional line D-D' of FIG. 7.

Referring to FIGS. 7 and 8, an image-sensor structure 600 is provided. The image-sensor structure 600 comprises a substrate 620, a plurality of photoelectric conversion units 640 formed in the substrate 620, a plurality of separated color filters 660 formed above the substrate 620 and the photoelectric conversion units 640, a first light shielding layer 680 surrounding the separated color filters 660 (as shown in FIG. 7), and a first conductive polymer element 700 filled between the individual separated color filters 660 and between the all separated color filters 660 and the first light shielding layer 680. The first conductive polymer element 700 is electrically connected, for example, "physically connected" or "not physically connected but through by means of a conducting path" to a grounding pad 720. Additionally, the photoelectric conversion units 640 and the separated color filters 660 are aligned with each other.

In some embodiments, the photoelectric conversion unit 640 may comprise a photodiode (PD).

In some embodiments, the color filters 660 may comprise pigments, acrylic resins or sensitive polymers.

In some embodiments, the first light shielding layer 680 may comprise pigments, acrylic resins or sensitive polymers.

In some embodiments, the image-sensor structure 600 may further comprise a component blended with the first conductive polymer element 700. In some embodiments, the component may comprise fluoroacrylic polymers, fluoroacrylic copolymers, or a combination thereof. In some embodiments, the component has a refractive index lower than about 1.5. In some embodiments, the component has a weight ratio of about 1-10 wt % or 1-20 wt % in the component and the first conductive polymer element 700.

In some embodiments, the image-sensor structure 600 may further comprise a second light shielding layer 740 surrounding the first light shielding layer 680 (as shown in FIG. 7). In some embodiments, the second light shielding layer 740 may comprise metals.

FIG. 8 represents the relationship among various elements, for example, metal line and metal via, in a conductive path. Referring to FIG. 8, in this embodiment, the image-sensor structure 600 may further comprise a fourth conductive polymer element 700' that connected the first conductive polymer element 700 and the grounding pad 720. The fourth conductive polymer element 700' goes across the first light shielding layer 680 and goes over the second light shielding layer 740. In this embodiment, the first conductive polymer element 700 is electrically connected to the grounding pad 720 through the fourth conductive polymer element 700'. The area where the metal line and the metal via located may further include an anti-reflection layer, an anti-leakage layer, or layers of specific functions. In a front-side illuminated image-sensor structure, the area may further include a wiring layer.

In some embodiments, the image-sensor structure 600 may further comprise a plurality of microlenses (not shown) formed above the separated color filters 660.

In some embodiments, the image-sensor structure 600 may comprise a front-side illuminated image-sensor structure (not shown) or a back-side illuminated image-sensor structure (not shown).

The invention adopts a conductive polymer blended with a low-refractive-index component, for example, fluoroacrylic polymers, fluoroacrylic copolymers, or a combination thereof to define an element(s) filled between color filters and between the color filters and a light shielding layer and connected to a grounding pad. The SNR (signal-to-noise ratio) of the image-sensor structure with the conductive polymer element(s) can thus be improved and the electrostatic charges generated during the semiconductor processes can thus be released from the image-sensor structure due to the formation of the conductive polymer element(s) with an adjustable refractive index which can increase the variation of the refractive index between the element(s) and the color filters and the arrangement of the electrical connection from the conductive polymer element(s) to the grounding pad which can effectively release the electrostatic charges. Additionally, the conductive polymer element(s) is formed by, for example, a process of coating, exposing, and developing (lithography), a process of etching or a process of chemical vapor deposition.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An image-sensor structure, comprising:
   a substrate;
   a plurality of photoelectric conversion units formed in the substrate;
   a plurality of separated color filters formed above the substrate and the photoelectric conversion units;
   a first light shielding layer surrounding the separated color filters; and
   a first conductive polymer element filled between the individual separated color filters and between the all separated color filters and the first light shielding layer, wherein the first conductive polymer element is electrically connected to a grounding pad.

2. The image-sensor structure as claimed in claim 1, wherein the photoelectric conversion unit comprises a photodiode.

3. The image-sensor structure as claimed in claim 1, wherein the color filters comprise pigments, acrylic resins or sensitive polymers.

4. The image-sensor structure as claimed in claim 1, wherein the first light shielding layer comprises pigments, acrylic resins or sensitive polymers.

5. The image-sensor structure as claimed in claim 1, further comprising a component blended with the first conductive polymer element.

6. The image-sensor structure as claimed in claim 5, wherein the component comprises fluoroacrylic polymers, fluoroacrylic copolymers, or a combination thereof.

7. The image-sensor structure as claimed in claim 6, wherein the component has a refractive index lower than 1.5.

8. The image-sensor structure as claimed in claim 5, wherein the component has a weight ratio of 1-20 wt % in the component and the first conductive polymer element.

9. The image-sensor structure as claimed in claim 1, further comprising a second light shielding layer surrounding the first light shielding layer.

10. The image-sensor structure as claimed in claim 9, wherein the second light shielding layer comprises metals.

11. The image-sensor structure as claimed in claim 1, wherein the first conductive polymer element is electrically connected to the grounding pad through metal vias and a metal line.

12. The image-sensor structure as claimed in claim 9, further comprising a second conductive polymer element connected with the first conductive polymer element, wherein the second conductive polymer element is in contact with the second light shielding layer.

13. The image-sensor structure as claimed in claim 12, wherein the first conductive polymer element is electrically connected to the grounding pad through the second conductive polymer element, the second light shielding layer, metal vias and a metal line.

14. The image-sensor structure as claimed in claim 9, further comprising a third conductive polymer element that connected the first conductive polymer element and the second light shielding layer, wherein the third conductive polymer element goes across the first light shielding layer.

15. The image-sensor structure as claimed in claim 14, wherein the first conductive polymer element is electrically connected to the grounding pad through the third conductive polymer element, the second light shielding layer, metal vias and a metal line.

16. The image-sensor structure as claimed in claim 9, further comprising a fourth conductive polymer element that connected the first conductive polymer element and the grounding pad to connect to.

17. The image-sensor structure as claimed in claim 16, wherein the fourth conductive polymer element goes across the first light shielding layer and goes over the second light shielding layer.

18. The image-sensor structure as claimed in claim 16, wherein the first conductive polymer element is electrically connected to the grounding pad through the fourth conductive polymer element.

19. The image-sensor structure as claimed in claim 1, further comprising a plurality of microlenses formed above the separated color filters.

20. The image-sensor structure as claimed in claim 19, wherein the image-sensor structure comprises a front-side illuminated image-sensor structure or a back-side illuminated image-sensor structure.

\* \* \* \* \*